United States Patent
Schricker

(10) Patent No.: US 8,304,284 B2
(45) Date of Patent: *Nov. 6, 2012

(54) MEMORY CELL THAT EMPLOYS A SELECTIVELY FABRICATED CARBON NANO-TUBE REVERSIBLE RESISTANCE-SWITCHING ELEMENT, AND METHODS OF FORMING THE SAME

(75) Inventor: April D. Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 72 days.

This patent is subject to a terminal disclaimer.

(21) Appl. No.: 12/410,771

(22) Filed: Mar. 25, 2009

(65) Prior Publication Data

US 2009/0256130 A1 Oct. 15, 2009

Related U.S. Application Data

(60) Provisional application No. 61/044,406, filed on Apr. 11, 2008.

(51) Int. Cl.
*H01L 21/44* (2006.01)

(52) U.S. Cl. ................ 438/100; 438/131; 257/E21.005; 977/742

(58) Field of Classification Search .................. 438/100, 438/131; 257/E21.005; 977/742
See application file for complete search history.

(56) References Cited

U.S. PATENT DOCUMENTS

| | | | |
|---|---|---|---|
| 5,854,102 A | 12/1998 | Gonzalez et al. | |
| 5,915,167 A | 6/1999 | Leedy | |
| 6,034,882 A | 3/2000 | Johnson et al. | |
| 6,706,402 B2 | 3/2004 | Rueckes et al. | |
| 6,858,481 B2 | 2/2005 | Krieger et al. | |
| 6,946,719 B2 | 9/2005 | Petti et al. | |
| 6,952,030 B2 | 10/2005 | Herner | |
| 7,176,064 B2 | 2/2007 | Herner | |
| 7,208,372 B2 | 4/2007 | Hsu et al. | |
| 7,286,388 B1 | 10/2007 | Chen et al. | |
| 7,385,266 B2 | 6/2008 | Segal et al. | |
| 7,405,465 B2 | 7/2008 | Herner | |
| 7,575,984 B2 | 8/2009 | Radigan | |
| 7,638,383 B2 | 12/2009 | Jin et al. | |
| 2004/0160812 A1 | 8/2004 | Rinerson et al. | |
| 2006/0214183 A1 | 9/2006 | Gaun et al. | |
| 2006/0250836 A1 | 11/2006 | Herner | |

(Continued)

FOREIGN PATENT DOCUMENTS

EP 1 796 103 6/2007

(Continued)

OTHER PUBLICATIONS

Subramanian et al., "High-Performance Germanium-Seeded Laterally Crystallized TFTs for Vertical Device Integration," Electron Devices, IEEE Transactions; Publication Date: Sep. 1998, vol. 45, Issue 9, pp. 1934-1939.

(Continued)

*Primary Examiner* — Trung Dang
(74) *Attorney, Agent, or Firm* — Dugan & Dugan, PC

(57) ABSTRACT

In some aspects, a method of fabricating a memory cell is provided that includes fabricating a steering element above a substrate, and fabricating a reversible-resistance switching element coupled to the steering element by fabricating a carbon nano-tube ("CNT") seeding layer by depositing a silicon-germanium layer above the substrate, patterning and etching the CNT seeding layer, and selectively fabricating CNT material on the CNT seeding layer. Numerous other aspects are provided.

20 Claims, 12 Drawing Sheets

U.S. PATENT DOCUMENTS

| | | | |
|---|---|---|---|
| 2006/0268594 A1 | 11/2006 | Toda | |
| 2007/0018228 A1 | 1/2007 | Sandhu et al. | |
| 2007/0037414 A1 | 2/2007 | Yamauchi et al. | |
| 2007/0103963 A1 | 5/2007 | Kim et al. | |
| 2007/0132049 A1 | 6/2007 | Stipe | |
| 2007/0133266 A1 | 6/2007 | Furukawa et al. | |
| 2007/0158697 A1 | 7/2007 | Choi et al. | |
| 2007/0190722 A1 | 8/2007 | Herner | |
| 2007/0238319 A1 | 10/2007 | Jewell-Larsen et al. | |
| 2008/0070162 A1 | 3/2008 | Ufert | |
| 2008/0157257 A1 | 7/2008 | Bertin et al. | |
| 2008/0165574 A1 | 7/2008 | Kim et al. | |
| 2008/0182408 A1 | 7/2008 | Lee et al. | |
| 2009/0001343 A1 | 1/2009 | Schricker et al. | |
| 2009/0001345 A1 | 1/2009 | Schricker et al. | |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |
| 2009/0256131 A1 | 10/2009 | Schricker | |

FOREIGN PATENT DOCUMENTS

| | | |
|---|---|---|
| EP | 1 892 722 | 2/2008 |
| WO | WO 2006-061599 | 6/2006 |
| WO | WO 2006/102391 A2 | 9/2006 |
| WO | WO 2006-122111 A2 | 11/2006 |
| WO | WO 2006-133949 | 12/2006 |
| WO | WO 2008-021900 | 2/2008 |

OTHER PUBLICATIONS

International Search Report and Written Opinion of International Application No. PCT/US2009/040189 mailed Jul. 16, 2009.

Abdi et al., "PECVD-Grown Carbon Nanotubes on Silicon Substrates with a Nickel-Seeded Tip-Growth Structure", Science Direct—Materials Science and Engineering C 26 (2006), pp. 1219-1223.

Choi et al., "Ultrahigh-density Nanotransistors by using Selectively Grown Vertical Carbon Nanotubes", Nov. 26, 2001, Applied Physics Letters, vol. 79, No. 22, pp. 3696-3698.

Herner et al., "Polysilicon Memory Switching: Electrothermal-Induced Order", Sep. 2006, IEEE Transactions on Electron Devices, vol. 53, No. 9, pp. 2320-2327.

Herner et al., "Vertical p-i-n Polysilicon Diode With Antifuse for Stackable Field-Programmable ROM", May 2004, IEEE Electron Device Letters, vol. 25, No. 5, pp. 271-273.

Li et al., "Bottom-up Approach for Carbon Nanotube Interconnects", Apr. 14, 2003, Applied Physics Letters, vol. 82, No. 15, pp. 2491-2493.

Malhi et al., "Characteristics and three-dimensional intergration of MOSFETs in small grain LPCVD polysilicon," IEEE J. Solid State Circuits, vol. SSC-20, pp. 178-201, Feb. 1985.

Meyyappan et al., "Carbon Nanotube Growth by PECVD: a Review", Plasma Sources Sci. Technol. 12 (2003), pp. 205-216.

Nozaki et al., "Fabrication of Vertically Aligned Single-Walled Carbon Nanotubes in Atmospheric Pressure Non-Thermal Plasma CVD", 2006, Science Direct-Carbon 45 (2007), pp. 364-374.

Rao et al., "In Situ-Grown Carbon Nanotube Array with Excellent Field Emission Characteristics", Jun. 19, 2000, Applied Physics Letters, vol. 76, No. 25, pp. 3813-3815.

Shin et al., "Influence of Morphology of Catalyst Thin Film on Vertically Aligned Carbon Nanotube Growth", Science Direct-Journal of Crystal Growth 271 (2004), pp. 81-89.

Smith et al., "Polishing TiN for Nanotube Synthesis", Nov. 2001, Proceedings of the 16th Annual Meeting of the American Society for Precision Engineering, pp. 1-4.

Son et al., "Electrical Switching in Metallic Carbon Nanotubes", Physical Review Letters, vol. 95, Issue 21, ID 216602, 2005.

Srivastava et al., "Carbon Nanotube Interconnects: Implications for Performance, Power Dissipation and Thermal Management", 2005, IEEE, pp. 1-4.

Uchino et al., "Catalyst Free Low Temperature Direct Growth of Carbon Nanotubes", Jul. 2005, Proceedings of 2005 5th IEEE Conference on Nanotechnology, pp. 1-4.

International Search Report and Written Opinion of International Application No. PCT/US2009/040131 mailed Jun. 29, 2010.

Restriction Requirement of U.S. Appl. No. 12/410,789 mailed Nov. 22, 2010.

Dec. 22, 2010 Response to Restriction Requirement of U.S. Appl. No. 12/410,789 mailed Nov. 22, 2010.

Communication pursuant to Rules 161(1) and 162 EPC of European Patent Application No. 09739405.0 dtd Nov. 18, 2010.

Dec. 22, 2010 Response to Nov. 18, 2010 Communication pursuant to Rules 161(1) and 162 EPC of related European Patent Application No. 09739405.0.

Office Action of U.S. Appl. No. 12/410,789 mailed Mar. 11, 2011.

Jun. 13, 2011 Reply to Mar. 11, 2011 Office Action of related U.S. Appl. No. 12/410,789.

Final Office Action of U.S. Appl. No. 12/410,789 mailed Aug. 31, 2011.

Schricker et al., U.S. Appl. No. 13/235,409, filed Sep. 18, 2011.

Ago et al., "Workfunction of Purified and Oxidised Carbon Nanotubes," Synthetic Metals, vol. 103, pp. 2494-2495 (1999).

Jang, J.E. et al. "Nanoelectromechanical switches with vertically aligned carbon nanotubes", Applied Physics Letters, vol. 87, (2005) pp. 163114-1-163114-3.

Nov. 29, 2011 Response to Aug. 31, 2011 Final Office Action of related U.S. Appl. No. 12/410,789.

Communication pursuant to Rules 161(1) and 162 PCT of European Patent Application No. 09730256.6 dated Nov. 22, 2010.

Dec. 21, 2010 Reply to Nov. 22, 2010 Communication pursuant to Rules 161(1) and 162 PCT of European Patent Application No. 09730256.6.

Office Action of related U.S. Appl. No. 12/410,789 mailed Mar. 2, 2012.

Final Office Action of related U.S. Appl. No. 12/410,789 mailed Jun. 21, 2012.

Office Action of related Chinese Patent Application Serial No. 200980120069.5 dated May 3, 2012.

Sep. 10, 2012 Response to Jun. 21, 2012 Final Office Action of related U.S. Appl. No. 12/410,789.

Sep. 7, 2012 Response to May 4, 2012 Office Action of related Chinese Patent Application Serial No. 200980122196.9.

Advisory Action of related U.S. Appl. No. 12/410,789 Sep. 21, 2012.

MEMORY CELL THAT EMPLOYS A SELECTIVELY FABRICATED CARBON NANO-TUBE REVERSIBLE RESISTANCE-SWITCHING ELEMENT, AND METHODS OF FORMING THE SAME

REFERENCE TO RELATED APPLICATIONS

This application claims the benefit of U.S. Provisional Patent Application No. 61/044,406, filed Apr. 11, 2008, which is incorporated by reference herein in its entirety for all purposes.

This application is related to the following patent applications, each of which is hereby incorporated by reference herein in its entirety for all purposes: (1) U.S. patent application Ser. No. 12/410,789, filed on even date herewith and titled "Memory Cell That Employs A Selectively Fabricated Carbon Nano-Tube Reversible Resistance-Switching Element Formed Over A Bottom Conductor And Methods Of Forming The Same;" (2) U.S. patent application Ser. No. 11/968,156, filed Dec. 31, 2007 and titled "Memory Cell That Employs A Selectively Fabricated Carbon Nano-Tube Reversible Resistance-Switching Element Formed On A Bottom Conductor And Methods Of Forming The Same;" (3) U.S. patent application Ser. No. 11/968,159, filed Dec. 31, 2007 and titled "Memory Cell With Planarized Carbon Nano-tube Layer And Methods Of Forming The Same;" (4) U.S. patent application Ser. No. 11/968,154, filed Dec. 31, 2007 and titled "Memory Cell That Employs A Selectively Fabricated Carbon Nano-Tube Reversible Resistance-Switching Element And Methods Of Forming The Same;" and (5) U.S. Provisional Patent Application Ser. No. 61/044,414, filed Apr. 11, 2008 and titled "Memory Cell That Employs A Selectively Fabricated Carbon Nano-Tube Reversible Resistance-Switching Element Formed Over A Bottom Conductor And Methods Of Forming The Same."

BACKGROUND

The present invention relates to non-volatile memories, and more particularly to a memory cell that employs a selectively fabricated carbon nano-tube ("CNT") reversible resistance-switching element and methods of forming the same.

Non-volatile memories formed from reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity switching material such as carbon.

However, fabricating memory devices from rewriteable resistivity-switching materials is technically challenging. Improved methods of forming memory devices that employ resistivity-switching materials are desirable.

SUMMARY

In a first aspect of the invention, a method of fabricating a memory cell is provided that includes: (1) fabricating a steering element above a substrate; and (2) fabricating a reversible-resistance switching element coupled to the steering element by: (a) fabricating a CNT seeding layer by depositing a silicon-germanium ("Si/Ge") layer above the substrate, (b) patterning and etching the CNT seeding layer, and (c) selectively fabricating CNT material on the CNT seeding layer.

In a second aspect of the invention, a method of fabricating a memory cell is provided that includes: (1) fabricating a first conductor above a substrate; (2) fabricating a reversible-resistance switching element above the first conductor by: (a) fabricating a CNT seeding layer by depositing a Si/Ge layer above the first conductor, (b) patterning and etching the CNT seeding layer, and (c) selectively fabricating CNT material on the CNT seeding layer; (3) fabricating a diode above the first conductor; and (4) fabricating a second conductor above the diode and the reversible resistance-switching element.

In a third aspect of the invention, a method of fabricating a memory cell is provided that includes: (1) fabricating a thin film transistor having a source region and a drain region; (2) fabricating a first conductor coupled to the source region or the drain region of the transistor; (3) fabricating a reversible-resistance switching element coupled to the first conductor by: (a) fabricating a CNT seeding layer by depositing a Si/Ge layer above the first conductor; (b) patterning and etching the CNT seeding layer; and (c) selectively fabricating CNT material on the CNT seeding layer; (4) fabricating a diode above the first conductor; and (5) fabricating a second conductor above the reversible resistance-switching element.

In a fourth aspect of the invention, a memory cell is provided that includes: (1) a steering element; (2) a patterned and etched carbon nano-tube ("CNT") seeding layer comprising silicon-germanium; and (3) a reversible resistance-switching element coupled to the steering element and including CNT material selectively fabricated on the CNT seeding layer.

In a fifth aspect of the invention, a memory cell is provided that includes: (1) a first conductor; (2) a second conductor formed above the first conductor; (3) a diode formed between the first and second conductors; and (4) a CNT seeding layer comprising Si/Ge between the first and second conductors; and (5) a reversible resistance-switching element including CNT material selectively fabricated on the CNT seeding layer.

In a sixth aspect of the invention, a memory cell is provided that includes: (1) a thin film transistor having a source region and a drain region; (2) a first conductor coupled to the source region or the drain region; (3) a CNT seeding layer comprising Si/Ge fabricated above the first conductor; (4) a reversible resistance-switching element including CNT material selectively fabricated on the CNT seeding layer; and (5) a second conductor formed above the reversible resistance-switching element. Numerous other aspects are provided in accordance with these and other embodiments of the invention.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
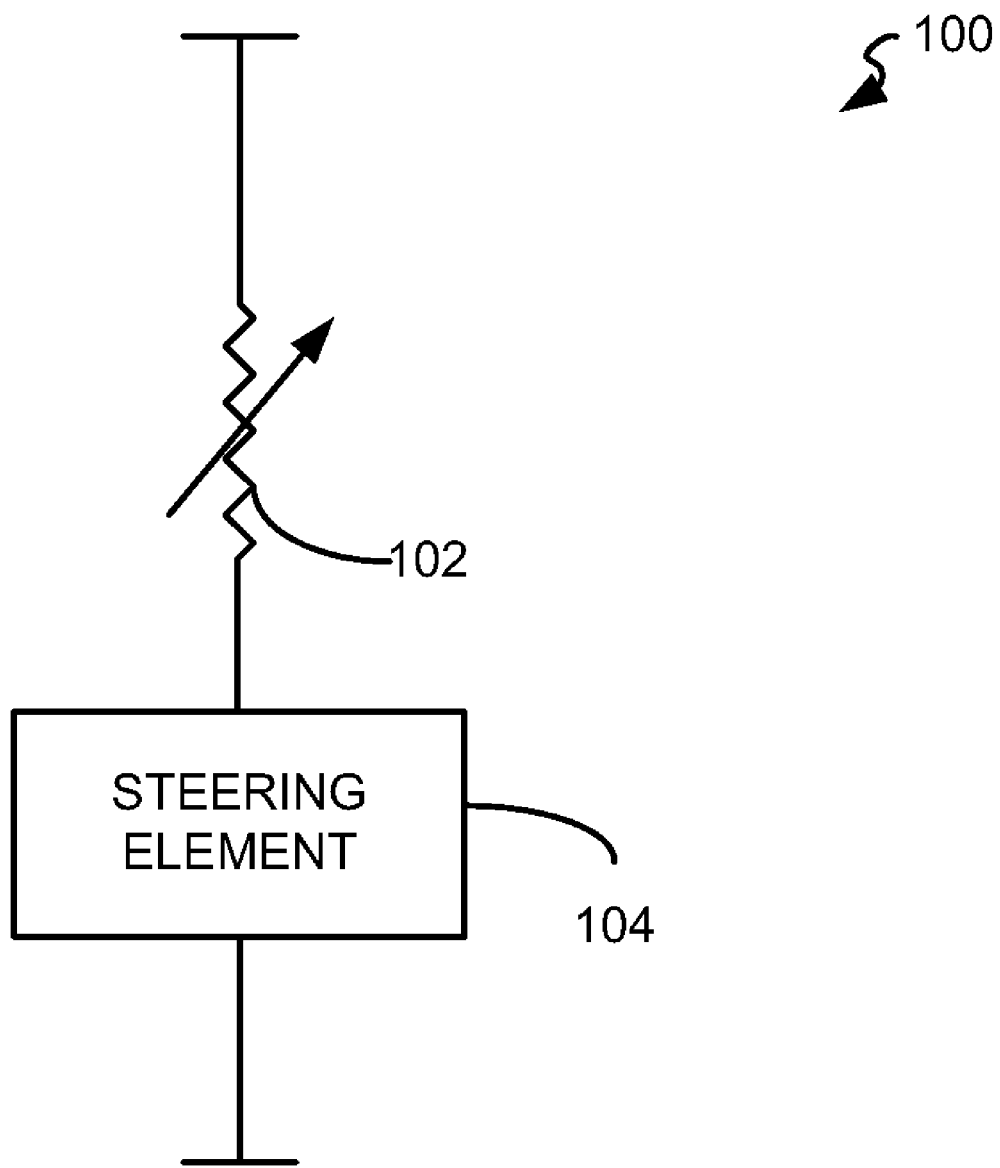
FIG. 1 is a schematic illustration of an exemplary memory cell provided in accordance with this invention.

Some CNT materials have been shown to exhibit reversible resistivity-switching properties that may be suitable for use in non-volatile memories. However, deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits.

In accordance with the present invention, difficult-to-etch, CNT rewriteable resistivity-switching materials may be used within a memory cell without being etched. For example, in at least one embodiment, a memory cell is provided that includes a CNT reversible resistivity-switching material formed by depositing a CNT seeding layer, patterning and etching the CNT seeding layer, and selectively fabricating CNT material on the patterned and etched CNT seeding layer. The CNT seeding layer may be a layer that facilitates CNT formation, such as (1) a single layer of roughened metal nitride, such as surface roughened titanium or tantalum nitride, (2) a multi-layer structure formed from a smooth or surface roughened metal nitride coated with a metal catalyst, (3) a single layer of a metal catalyst such as nickel, cobalt, iron, etc., or (4) a non-metal silicon-germanium ("Si/Ge") seed layer. Selective formation of CNT material on the CNT seeding layer can eliminate or minimize the need to etch the CNT material.

Exemplary CNT seeding layers include titanium nitride, tantalum nitride, nickel, cobalt, iron or the like, or a non-metal Si/Ge seed layer. In some embodiments, a titanium or tantalum nitride layer may be surface roughened for use as a CNT seeding layer. Such surface roughened titanium or tantalum nitride may itself serve as a CNT seeding layer. In other embodiments, the surface roughened titanium or tantalum nitride layer may be coated with an additional conducting layer to facilitate CNT material formation. Such a conducting layer may be patterned and etched with the titanium or tantalum nitride layer, or selectively deposited on the titanium or tantalum nitride layer after the titanium or tantalum nitride layer is patterned and etched. Exemplary conducting layers include nickel, cobalt, iron, etc.

As used herein, CNT material refers to material that includes one or more single and/or multi-wall CNTs. In some embodiments, the individual tubes of the CNT material may be vertically aligned. Vertically aligned CNTs allow vertical current flow with little or no lateral conduction. In some embodiments, the individual tubes of the CNT material may be fabricated to be substantially vertically aligned to reduce or prevent the formation of lateral or bridging conduction paths between adjacent memory cells. This vertical alignment reduces and/or prevents the state of a memory cell from being influenced or "disturbed" by the state and/or programming of adjacent memory cells. Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined. Exemplary techniques for forming CNT materials are described below.

Exemplary Inventive Memory Cell

FIG. 1 is a schematic illustration of an exemplary memory cell 100 provided in accordance with the present invention. Memory cell 100 includes a reversible resistance-switching element 102 coupled to a steering element 104.

Reversible resistance-switching element 102 includes a reversible resistivity-switching material (not separately shown) having a resistivity that may be reversibly switched between two or more states. For example, the reversible resistivity-switching material of element 102 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, reversible resistance-switching element 102 may be in an initial, high-resistance state upon fabrication that is reversibly switchable to a low-resistance state upon application of the appropriate voltage(s) and/or current(s).

When used in a memory cell, one resistance state may represent a binary "0," and another resistance state may represent a binary "1", although more than two data/resistance states may be used. Numerous reversible resistivity-switching materials and operation of memory cells employing reversible resistance-switching elements are described, for example, in U.S. patent application Ser. No. 11/125,939, filed May 9, 2005 and titled "Rewriteable Memory Cell Comprising A Diode And A Resistance-Switching Material," which is hereby incorporated by reference herein in its entirety for all purposes.

In at least one embodiment of the invention, reversible resistance-switching element 102 is formed using a selectively deposited or grown CNT material. As will be described further below, use of a selectively formed CNT material eliminates the need to etch the CNT material. Fabrication of reversible resistance-switching element 102 thereby is simplified. In the remaining discussion, reversible resistance-switching element 102 will also be referred to as CNT element 102.

Steering element 104 may include a thin film transistor, a diode, or another suitable steering element that exhibits non-ohmic conduction by selectively limiting the voltage across and/or the current flow through the reversible resistance-switching element 102. In this manner, memory cell 100 may be used as part of a two or three dimensional memory array and data may be written to and/or read from memory cell 100 without affecting the state of other memory cells in the array.

Memory cell 100 operates based on a bi-stable resistance change in CNT element 102 with the application of high programming voltage (e.g., greater than about 4 V). Current through memory cell 100 is modulated by the resistance of CNT element 102. Memory cell 100 may be read at a voltage lower than the programming voltage that will not change the resistance of CNT element 102. The difference in resistivities between the two states is over 100×, as described in Rueckes, et al. U.S. Pat. No. 6,706,402, which is hereby incorporated herein by reference in its entirety for all purposes.

Exemplary embodiments of memory cell 100, reversible resistance-switching element 102 and steering element 104 are described below with reference to FIGS. 2A-5.

First Exemplary Embodiment of a Memory Cell

Figure 2A:
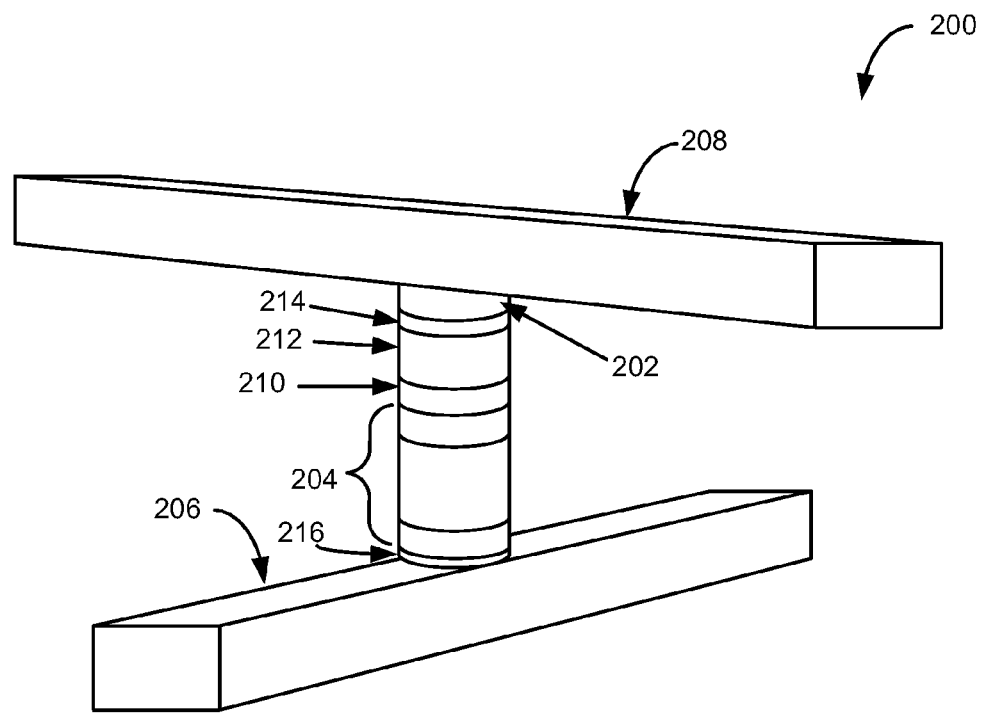
FIG. 2A is a simplified perspective view of a first embodiment of a memory cell provided in accordance with this invention.

FIG. 2A is a simplified perspective view of a first embodiment of a memory cell 200 provided in accordance with the present invention. With reference to FIG. 2A, memory cell 200 includes a reversible resistance-switching element 202 coupled in series with a diode 204 between a first conductor 206 and a second conductor 208. In some embodiments, a barrier layer 210, a conductive layer 212 and/or a CNT seeding layer 214 may be formed between reversible resistance-switching element 202 and diode 204. For example, barrier layer 210 may include titanium nitride, tantalum nitride, tungsten nitride, etc., and conductive layer 212 may include tungsten or another suitable metal layer.

In some embodiments, CNT seeding layer 214 may be a conducting layer that promotes CNT material formation, such as titanium nitride, tantalum nitride, nickel, cobalt, iron or the like. In one particular embodiment, CNT seeding layer 214 may be titanium or tantalum nitride with a surface roughened by chemical mechanical polishing ("CMP") or another suitable process. In other embodiments, a surface roughened or smooth titanium nitride, tantalum nitride or similar layer may be coated with a metal catalyst layer of nickel, cobalt, iron, etc., that promotes CNT material formation. In other embodiments, CNT seeding layer 214 may simply be a metal catalyst layer such as nickel, cobalt, iron or the like. In still other embodiments, CNT seeding layer 214 may be a nonmetal Si/Ge layer that promotes CNT formation.

As will be described further below, barrier layer 210, conductive layer 212 and/or CNT seeding layer 214 may serve as a hard mask during formation of diode 204. Use of metal hard masks is described, for example, in U.S. patent application Ser. No. 11/444,936, filed May 13, 2006 and titled "Conductive Hard Mask To Protect Patterned Features During Trench Etch" (hereinafter "the '936 Application") which is hereby incorporated by reference herein in its entirety for all purposes. An additional barrier layer 216, such as titanium nitride, tantalum nitride, tungsten nitride, etc., also may be formed between diode 204 and first conductor 206.

Patterning of CNT seeding layer 214 with conductive layer 212, barrier layer 210, diode 204 and/barrier layer 216 simplifies fabrication of memory cell 200 as additional patterning and etch steps are not required for CNT seeding layer 214. Further, CNT material will selectively (e.g., only) form on the patterned and etched CNT seeding layer 214 so that etching of CNT material is not required. This selectively formed CNT material serves as reversible resistance-switching element 202.

In some embodiments, only a portion, such as one or more filaments, of the CNT material that forms reversible resistance-switching element 202 may switch and/or be switchable.

Diode 204 may include any suitable diode such as a vertical polycrystalline p-n or p-i-n diode, whether upward pointing with an n-region above a p-region of the diode or downward pointing with a p-region above an n-region of the diode. Exemplary embodiments of diode 204 are described below with reference to FIG. 3A-C.

First and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first and/or second conductors 206 to improve device performance and/or aid in device fabrication.

Figure 2B:
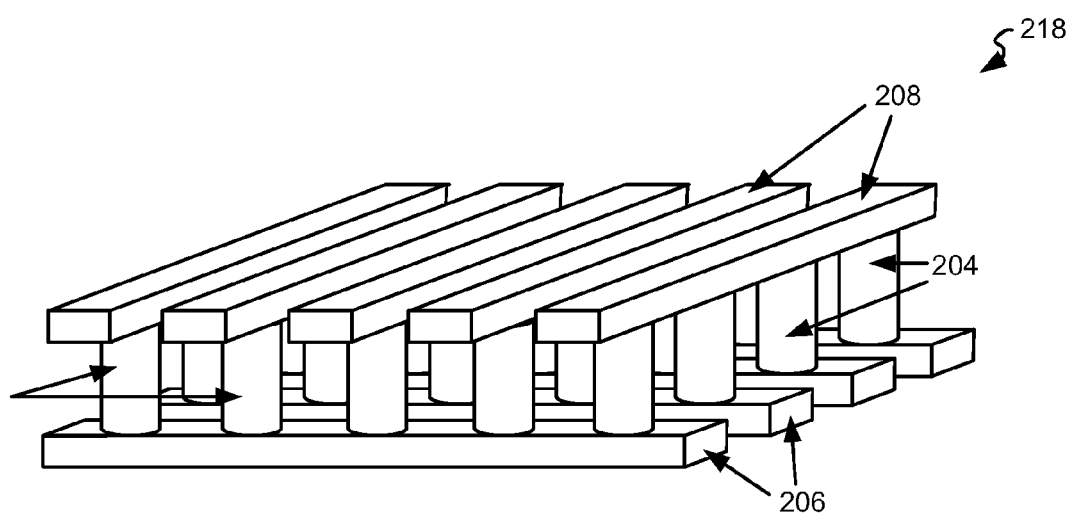
FIG. 2B is a simplified perspective view of a portion of a first memory level formed from a plurality of the memory cells of FIG. 2A.
Figure 2C:
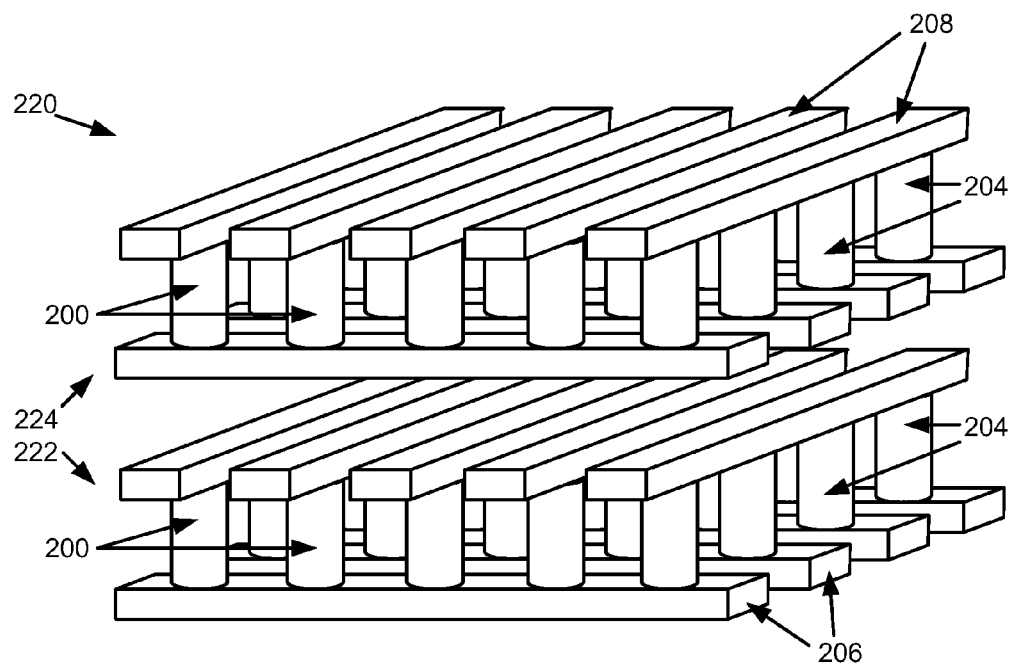
FIG. 2C is a simplified perspective view of a portion of a first exemplary three dimensional memory array provided in accordance with this invention.

FIG. 2B is a simplified perspective view of a portion of a memory array 218 formed from a plurality of memory cells 200 of FIG. 2A. For simplicity, reversible resistance-switching element 202, CNT seeding layer 214, diode 204, barrier layers 210 and 216 and conductive layer 212 are not separately shown. Memory array 218 is a "cross-point" array including a plurality of bit lines (second conductors 208) and word lines (first conductors 206) to which multiple memory cells are coupled (as shown). Other memory array configurations may be used, as may multiple levels of memory. For example, FIG. 2C is a simplified perspective view of a portion of a monolithic three dimensional array 220 that includes a first memory level 222 positioned below a second memory level 224. In the embodiment of FIG. 2C, each memory level 222, 224 includes a plurality of memory cells 200 in a cross-point array. It will be understood that additional layers (e.g., an interlevel dielectric) may be present between first and second memory levels 222 and 224, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
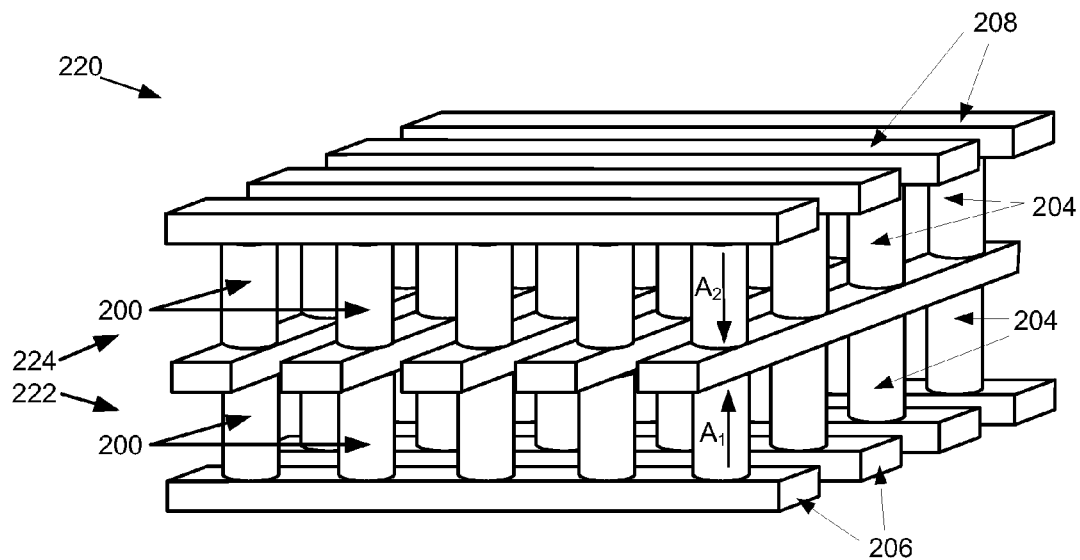
FIG. 2D is a simplified perspective view of a portion of a second exemplary three dimensional memory array provided in accordance with this invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692, 151, filed Mar. 27, 2007 and titled "Large Array Of Upward Pointing P-I-N Diodes Having Large And Uniform Current," which is hereby incorporated by reference herein in its entirety for all purposes. For example, the diodes of first memory level 222 may be upward pointing diodes as indicated by arrow $A_1$ (e.g., with p regions at the bottom of the diodes), whereas the diodes of second memory level 224 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 3A:
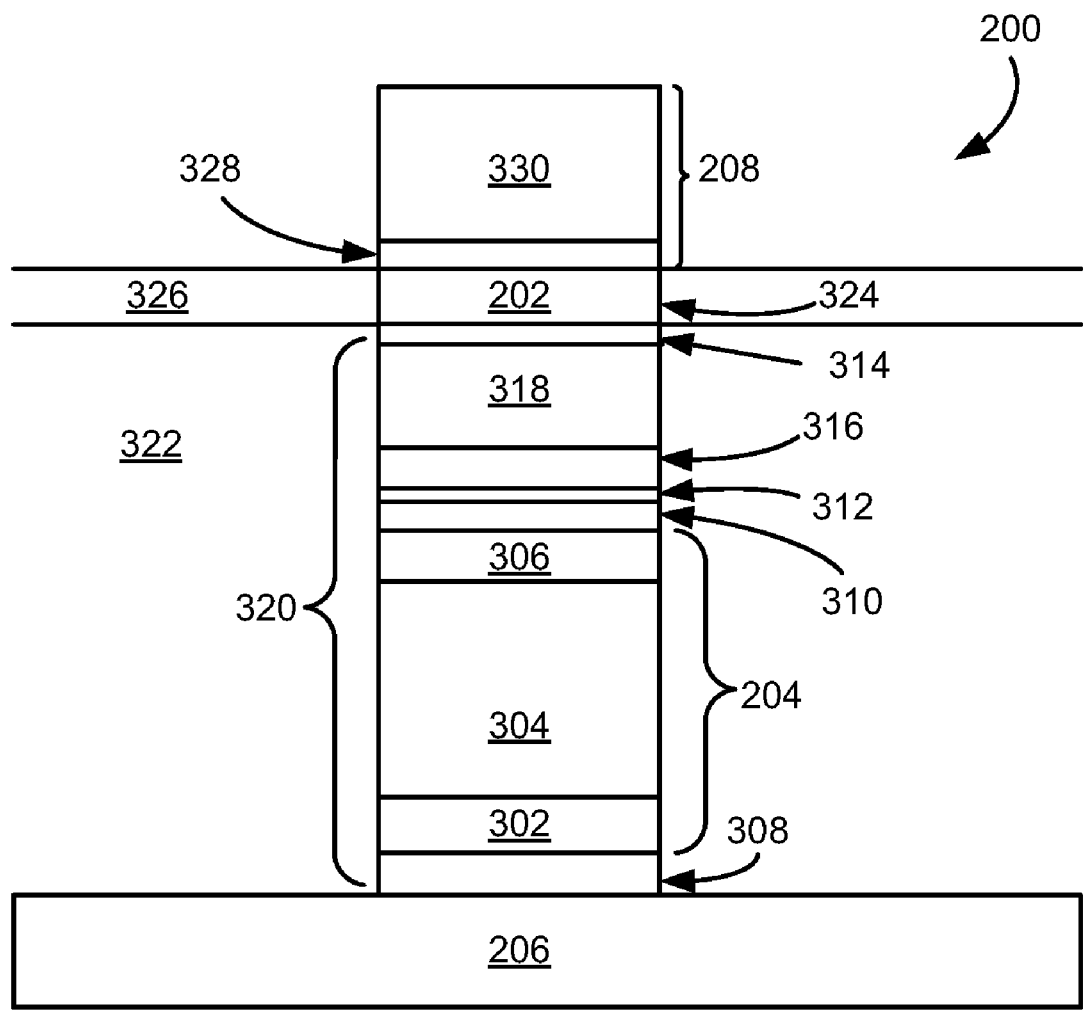
FIG. 3A is a cross-sectional view of a first exemplary embodiment of the memory cell of FIG. 2A.

FIG. 3A is a cross-sectional view of a first exemplary embodiment of memory cell 200 of FIG. 2A. With reference to FIG. 3A, memory cell 200 includes reversible resistance-switching element 202, diode 204 and first and second conductors 206, 208.

As stated, diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 204 may be formed from a polycrystalline semiconductor material such as polysilicon, a polycrystalline silicon-germanium alloy, polygermanium or any other suitable material. For example, diode 204 may include a heavily doped n+ polysilicon region 302, a lightly doped or an intrinsic (unintentionally doped) polysilicon region 304 above n+ polysilicon region 302 and a heavily doped, p+ polysilicon region 306 above intrinsic region 304. In some embodiments, a thin germanium and/or silicon-germanium alloy layer (not shown) may be formed on n+ polysilicon region 302 to prevent and/or reduce dopant migration from n+ polysilicon region 302 into intrinsic region 304. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (hereinafter "the '331 Application"), which is hereby incorporated by reference herein in its entirety for all purposes. In some embodiments, a few hundred angstroms or less of silicon-germanium alloy with about 10 at % or more of germanium may be employed.

It will be understood that the locations of the n+ and p+ regions may be reversed. A barrier layer 308, such as titanium nitride, tantalum nitride, tungsten nitride, etc., may be formed between first conductor 206 and n+ region 302 (e.g., to prevent and/or reduce migration of metal atoms into the polysilicon regions).

When diode 204 is fabricated from deposited silicon (e.g., amorphous or polycrystalline), a silicide layer 310 may be formed on diode 204 to place the deposited silicon in a low resistivity state, as fabricated. Such a low resistivity state allows for easier programming of memory cell 200, as a large voltage is not required to switch the deposited silicon to a low resistivity state. For example, a silicide-forming metal layer 312 such as titanium or cobalt may be deposited on p+ polysilicon region 306. During a subsequent anneal step (described below) employed to crystallize the deposited silicon that forms diode 204, silicide-forming metal layer 312 and the deposited silicon of diode 204 interact to form silicide layer 310, consuming all or a portion of silicide-forming metal layer 312.

As described in U.S. Pat. No. 7,176,064, "Memory Cell Comprising a Semiconductor Junction Diode Crystallized Adjacent to a Silicide," which is hereby incorporated by reference herein in its entirety for all purposes, silicide-forming materials such as titanium and/or cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., silicide layer 310 enhances the crystalline structure of silicon diode 204 during annealing). Lower resistivity silicon thereby is provided. Similar results may be achieved for silicon-germanium alloy and/or germanium diodes.

In the embodiment of FIG. 3A, reversible resistance-switching element 202 is formed by a selective fabrication process in which CNT material is formed on a patterned and etched CNT seeding layer 314. In some embodiments, CNT seeding layer 314 may be (1) a single layer of roughened metal nitride, such as surface roughened titanium or tantalum nitride, (2) a multi-layer structure formed from a smooth or surface roughened metal nitride coated with a metal catalyst, (3) a single layer of a metal catalyst such as nickel, cobalt, iron, etc., or (4) a non-metal Si/Ge seed layer. Exemplary CNT seeding layer materials include titanium or tantalum nitride and/or nickel, cobalt, iron or another suitable metal and/or catalyst, or a non-metal Si/Ge material.

In some embodiments, CNT seeding layer 314 and reversible resistance-switching element 202 may be formed over conductive silicide-forming metal layer 312. In such embodiments, CNT seeding layer 314 and silicide-forming metal layer 312 may be patterned and etched during formation of diode 204 as described below with reference to FIGS. 4A-4D. In other embodiments, a metal hard mask may be formed over silicide-forming metal layer 312 prior to formation of CNT seeding layer 314 and resistance-switching element 202. For example, a barrier layer 316 and/or a conductive layer 318 may be formed over silicide-forming metal layer 312. CNT seeding layer 314 then may be formed over conductive layer 318. Barrier layer 316 may include titanium nitride, tantalum nitride, tungsten nitride, etc., and conductive layer 318 may include tungsten or another suitable metal layer.

As will be described further below, barrier layer 316 and/or conductive layer 318, as well as CNT seeding layer 314, may serve as a hard mask during formation of diode 204 and may mitigate any overetching that may occur during formation of top conductor 208 (as described in the '936 Application, previously incorporated). For example, CNT seeding layer 314, barrier layer 316 and conductive layer 318 may be patterned and etched, and then serve as a mask during etching of diode 204. Etching of CNT seeding layer 314, conductive layer 318, barrier layer 316, silicide-forming metal layer 312, diode 204 (p+ polysilicon layer 306, intrinsic layer 304, n+ polysilicon layer 302) and barrier layer 308 creates a pillar structure 320. Dielectric material 322 is deposited on top of and around pillar structure 320 to isolate pillar structure 320 from other similar pillar structures of other memory cells (not shown) fabricated on a memory level that includes memory cell 200. A CMP or dielectric etchback step then is performed to planarize the dielectric material 322 and remove the dielectric material from the top of CNT seeding layer 314.

Such a CMP or dielectric etchback step may also roughen the surface of CNT seeding layer 314. For example, in some embodiments, CNT seeding layer 314 may include titanium nitride that is roughened by the CMP or dielectric etchback step just described and/or by an additional roughening step. Such a roughened, titanium nitride surface may be employed as a seeding surface for CNT fabrication. For example, roughened titanium nitride has been shown to facilitate formation of vertically aligned CNTs as described by Smith et al., "Polishing TiN for Nanotube Synthesis", Proceedings of the 16$^{th}$ Annual Meeting of the American Society for Precision Engineering, Nov. 10-15, 2001 (the "Smith Article"); see also Rao et al., "In Situ-Grown Carbon Nanotube Array With Excellent Field Emission Characteristics", Appl. Phys. Letters, 76:25, 19 Jun. 2000, pp. 3813-3815 (the "Rao Article")).

As an example, CNT seeding layer 314 may be about 1000 to about 5000 angstroms of a metal nitride such as titanium or tantalum nitride with an arithmetic average surface roughness Ra of about 850 to about 4000 angstroms, and more preferably about 4000 angstroms. In some embodiments, about 1 to about 200 angstroms, and more preferably about 20 angstroms or less, of a metal catalyst layer such as nickel, cobalt, iron, etc., may be deposited onto the surface roughened metal nitride layer prior to CNT formation. In yet other embodiments, CNT seeding layer 314 may include about 20 to about 500 angstroms of non-roughened or smooth titanium, tantalum or similar metal nitride coated with about 1 to about 200 angstroms, and more preferably about 20 angstroms or less, of a metal catalyst layer such as nickel, cobalt, iron, etc. The nickel, cobalt, iron or other metal catalyst layer in any embodiment may be a continuous or non-continuous film. In still other embodiments, CNT seeding layer 314 may include about 1 to about 500 angstroms, and more preferably about 5 angstroms to about 19 angstroms of Si/Ge material. Other materials, thicknesses and surface roughnesses may be used.

Following planarization of dielectric material 322, a CNT fabrication process is performed to selectively grow and/or deposit CNT material 324 on CNT seeding layer 314. CNT material 324 serves as reversible resistance-switching element 202. Any suitable method may be used to form CNT material on CNT seeding layer 314. For example, chemical vapor deposition ("CVD"), plasma-enhanced CVD ("PECVD"), laser vaporization, electric arc discharge or the like may be employed.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst seeding layer such as nickel, cobalt, iron, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, ratios, powers and/or growth times may be used.

In still another embodiment, CNTs may be formed on a Si/Ge seeding layer using CVD or PECVD. To grow CNTs using the carbon implanted Si/Ge seeds, a CVD technique may be used with approximately 850° C. for approximately 10 minutes using methane diluted with $H_2$ gas. Other carbon precursors might be used to form CNTs as well.

As stated, CNT material 324 forms only over CNT seeding layer 314 of pillar structure 320 (and other similar pillar structures (not shown) of other memory cells fabricated on a memory level that includes memory cell 200). In some embodiments, CNT material 324 may have a thickness of about 1 nanometers to about 1 micron (and even tens of microns), and more preferably about 10 to about 20 nanometers, although other CNT material thicknesses may be used. The density of the individual tubes in CNT material 324 may be, for example, about $6.6 \times 10^3$ to about $1 \times 10^6$ CNTs/micron$^2$, and more preferably at least about $6.6 \times 10^4$ CNTs/micron$^2$, although other densities may be used. For example, assuming the pillar structure 320 has a width of about 45 nanometers, in some embodiments, it is preferred to have at least about 10 CNTs, and more preferably at least about 100 CNTs, in CNT material 324 (although fewer CNTs, such as 1, 2, 3, 4, 5, etc., or more CNTs, such as more than 100, may be employed).

To improve the reversible resistivity-switching characteristics of CNT material 324, in some embodiments it may be preferable that at least about 50%, and more preferably at least about ⅔, of the carbon nano-tubes of CNT material 324 are semiconducting. Multiple wall CNTs are generally metallic, while single wall CNTs may be metallic or semiconducting. In one or more embodiments, it may be preferable for CNT material 324 to include primarily semiconducting single wall CNTs. In other embodiments, fewer than 50% of the CNTs of CNT material 324 may be semiconducting.

Vertically aligned CNTs allow vertical current flow with little or no lateral conduction. To prevent the formation of lateral or bridging conduction paths between adjacent pillar structures 320, in some embodiments, the individual tubes of CNT material 324 may be fabricated to be substantially vertically aligned (e.g., thereby reducing and/or preventing the state of a memory cell from being influenced or "disturbed" by the state and/or programming of adjacent memory cells). Note that this vertical alignment may or may not extend over the entire thickness of CNT material 324. For example, during the initial growth phase, some or most of the individual tubes may be vertical aligned (e.g., not touching). However, as the individual tubes increase in length vertically, portions of the tubes may come in contact with one another, and even become entangled or entwined.

In some embodiments, defects may be intentionally created in the CNT material 324 to improve or otherwise tune the reversible resistivity-switching characteristics of CNT material 324. For example, after CNT material 324 has been formed on CNT seeding layer 314, argon, $O_2$ or another species may be implanted into CNT material 324 to create defects in CNT material 324. In a second example, CNT material 324 may be subjected or exposed to an argon or $O_2$ plasma (biased or chemical) to intentionally create defects in CNT material 324.

In some embodiments in accordance with this invention, following formation of CNT material 324, an anneal step may be performed prior to depositing dielectric material. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760T, whereas preferred pressures may range from about 300 mT to about 600 mT.

A queue time of preferably about 2 hours between the anneal and the dielectric deposition preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that CNT material may absorb water from the air over time. Likewise, it is believed that the moisture may increase the likelihood of de-lamination of the CNT material. In some cases, it also might be acceptable to have a que time of 2 hours from the time of CNT growth to dielectric deposition, skipping the anneal altogether.

Incorporation of such a post-CNT-formation-anneal preferably takes into account other layers present on the device that includes the CNT material, because these other layers will also be subject to the anneal. For example, the anneal may be omitted or its parameters may be adjusted where the aforementioned preferred anneal parameters would damage the other layers. The anneal parameters may be adjusted within ranges that result in the removal of moisture without damaging the layers of the annealed device. For instance, the temperature may be adjusted to stay within an overall thermal budget of a device being formed. Likewise, any suitable forming gases, temperatures and/or durations may be used that are appropriate for a particular device. In general, such an anneal may be used with any carbon-based layer or carbon-containing material, such as layers having CNT material, graphite, graphene, amorphous carbon, etc.

Following formation of CNT material 324/reversible resistance-switching element 202, dielectric material 326 is deposited on top of and around CNT material 324 to isolate CNT material 324 from other similar CNT material regions of other memory cells (not shown) fabricated on a memory level that includes memory cell 200. A CMP or dielectric etchback step then is performed to planarize dielectric material 326 and remove the dielectric material from the top of CNT material 324.

Following planarization of dielectric material 326, the top conductor 208 is formed. In some embodiments, one or more barrier layers and/or adhesion layers 328 may be formed over CNT material 324/reversible resistance-switching element 202 prior to deposition of conductive layer 330. Conductive layer 330 and barrier layer 328 may be patterned and/or etched together to form top conductor 208. In some embodiments, top conductor 208 may be formed using a damascene process as described below with reference to FIGS. 4A-4D.

Following formation of top conductor 208, memory cell 200 may be annealed to crystallize the deposited semiconductor material of diode 204 (and/or to form silicide layer 310). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, silicide layer 310 may serve as a "crystallization template" or "seed" during annealing for underlying deposited semiconductor material that forms diode 204. Lower resistivity diode material thereby is provided.

Figure 3B:
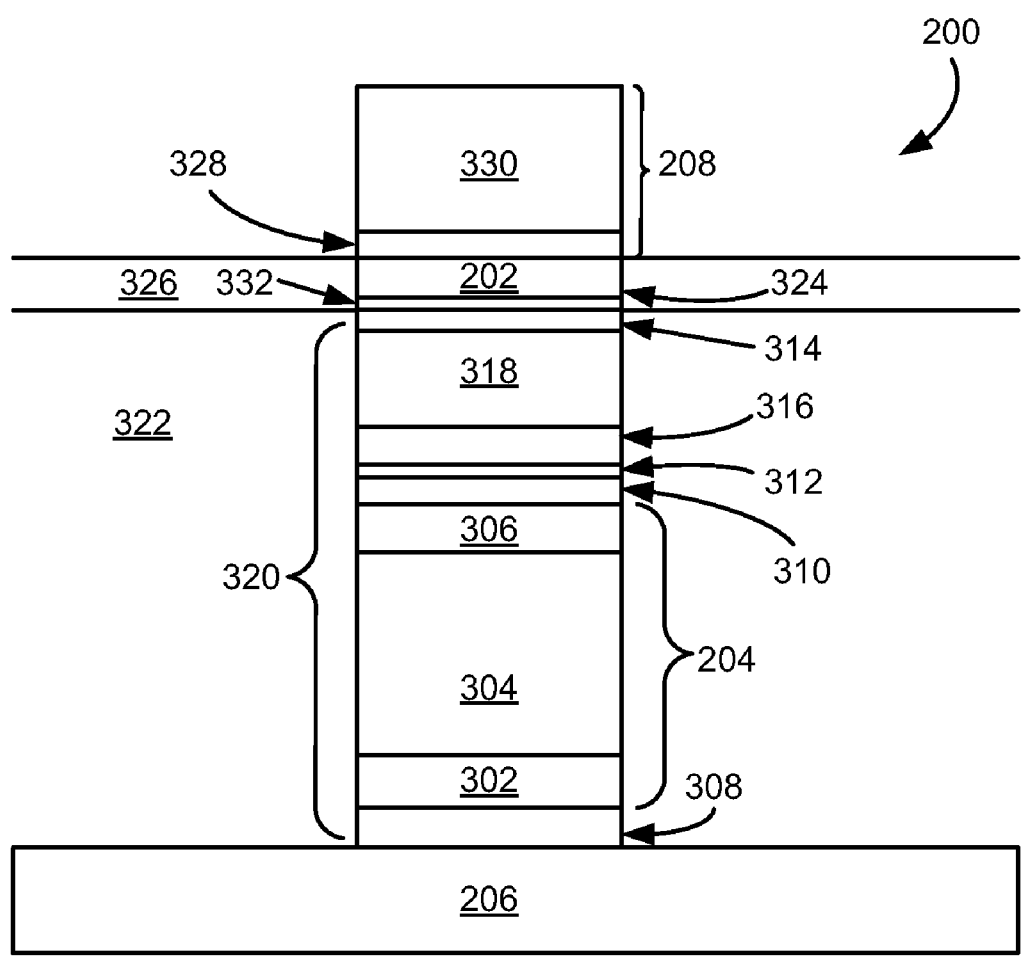
FIG. 3B is a cross-sectional view of a second exemplary embodiment of the memory cell of FIG. 2A.

In some embodiments, CNT seeding layer 314 may include one or more additional layers. For example, FIG. 3B is a cross-sectional view of a second exemplary embodiment of memory cell 200 of FIG. 2A in which CNT seeding layer 314 includes an additional metal catalyst layer 332. Metal catalyst layer 332 may be selectively deposited over the CMP or etchback exposed CNT seeding layer 314. For example, in some embodiments, a nickel, cobalt, iron, etc., metal catalyst layer 332 may be selectively formed over a surface roughened titanium or tantalum nitride CNT seeding layer 314 by electroless deposition, electroplating or the like. CNT material 324 then may be formed over the metal catalyst coated CNT seeding layer 314. In some embodiments, use of metal catalyst layer 332 may eliminate the need for a catalyst precursor during CNT formation. Exemplary metal catalyst layer thicknesses range from about 1 to 200 angstroms, although other thicknesses may be used. Such an embodiment may be used with or without metal hard mask layers 316 and 318. A nickel, cobalt, iron, or similar metal catalyst layer also may be formed over a non-surface-roughened or smooth titanium nitride, tantalum nitride or similar layer by electroless deposition, electroplating or the like.

Figure 3C:
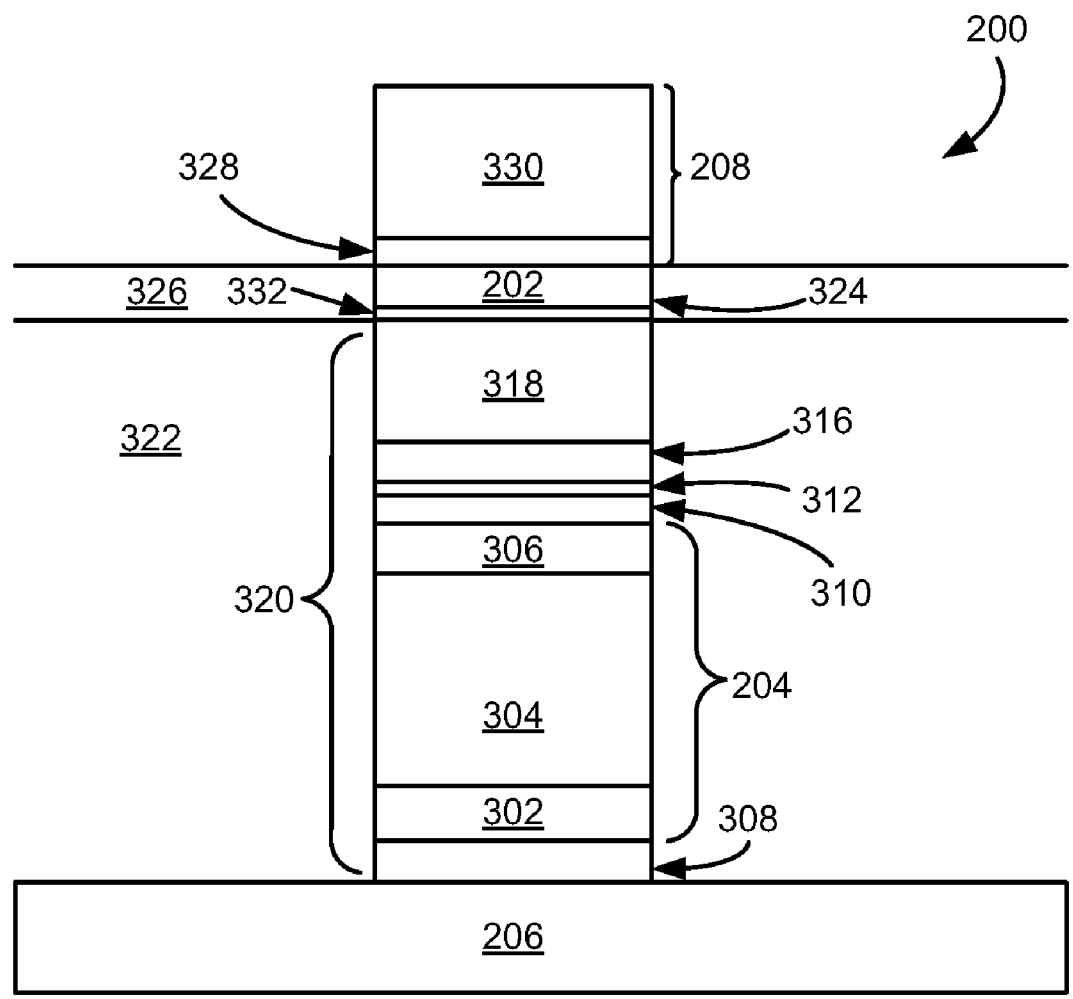
FIG. 3C is a cross-sectional view of a third exemplary embodiment of the memory cell of FIG. 2A.

In another embodiment, only metal catalyst layer 332 may be used for CNT seeding. For example, FIG. 3C is a cross-sectional view of a third exemplary embodiment of memory cell 200 of FIG. 2A. Memory cell 200 of FIG. 3C is similar to memory cell 200 of FIG. 3B, but does not include surface roughened CNT seeding layer 314. In the embodiment shown in FIG. 3C, no CNT seeding layer 314 is deposited over conductive layer 318 prior to formation of pillar structure 320. After pillar structure 320 is formed, dielectric material 322 is deposited on top of and around pillar structure 320 and planarized to expose the top of conductive layer 318. A metal catalyst layer 332 such as nickel, cobalt, iron, etc., then is selectively deposited on the exposed conductive layer 318, and CNT material 324 may be formed over metal catalyst layer 332. In general, such an embodiment may be used with or without metal hard mask layers 316 and 318.

Figure 3D:
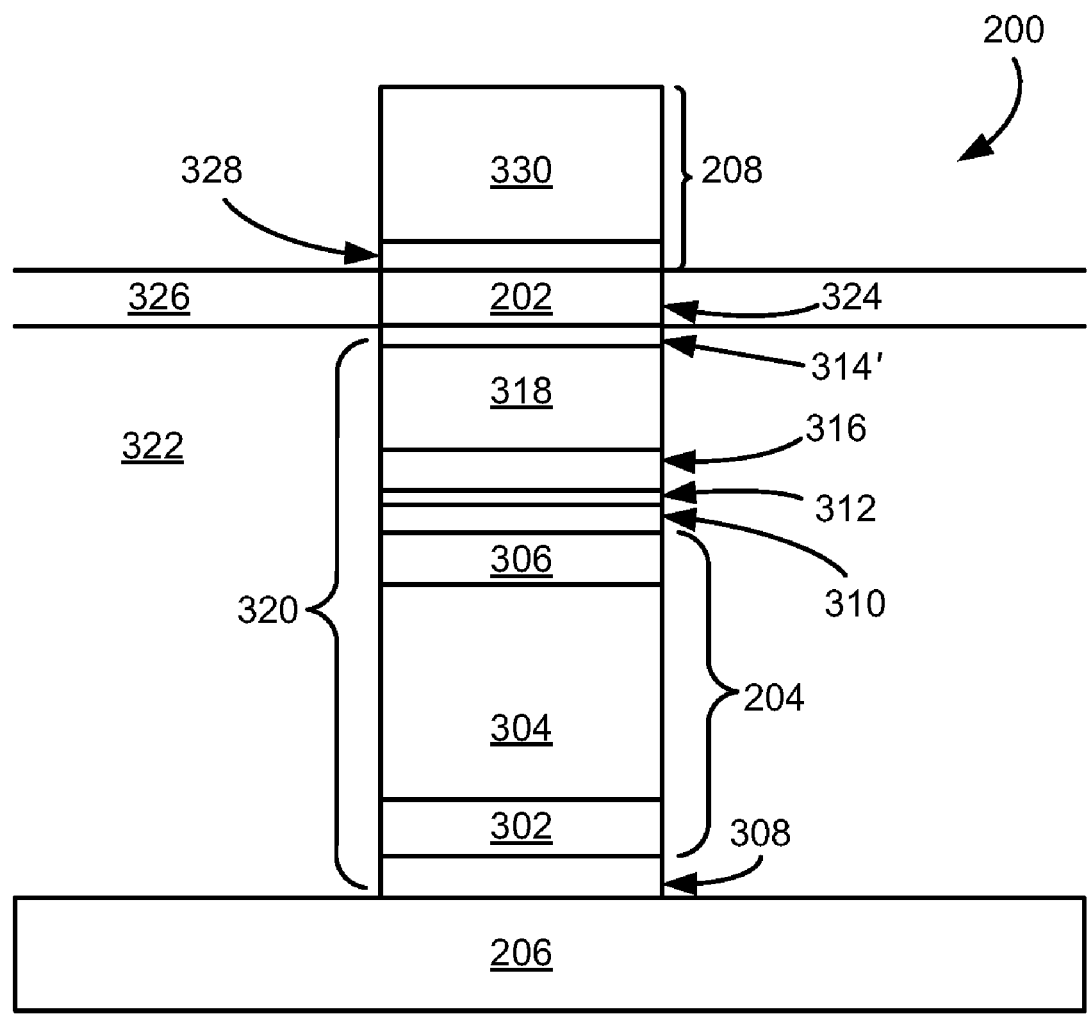
FIG. 3D is a cross-sectional view of a fourth exemplary embodiment of the memory cell of FIG. 2A.

In another alternative embodiment, a non-metal Si/Ge layer may be used for CNT seeding. For example, FIG. 3D is a cross-sectional view of a fourth exemplary embodiment of memory cell 200 of FIG. 2A. Memory cell 200 of FIG. 3D is similar to memory cell 200 of FIG. 3A, but includes a non-metal Si/Ge CNT seeding layer 314'. Using a non-metal Si/Ge seed has the advantage that silicon and germanium materials are compatible with conventional semiconductor fabrication facility materials, unlike iron-based metal CNT seed materials.

Si/Ge CNT seeding layer 314' may be formed over silicide-forming metal layer 312. In such embodiments, CNT seeding layer 314' and silicide-forming metal layer 312 may be patterned and etched during formation of diode 204 as described below with reference to FIGS. 4A-4D. An oxide layer (not shown) or Si/Ge CNT seeding layer 314' may be used as a hard mask for pattern transfer. In other embodiments, a metal hard mask may be formed over silicide-forming metal layer 312 prior to formation of CNT seeding layer 314' and resistance-switching element 202. For example, a barrier layer 316 and/or a conductive layer 318 may be formed over silicide-forming metal layer 312. CNT seeding layer 314' then may be formed over conductive layer 318. Barrier layer 316 may include titanium nitride, tantalum nitride, tungsten nitride, etc., and conductive layer 318 may include tungsten or another suitable metal layer.

As will be described further below, barrier layer 316 and/or conductive layer 318, and CNT seeding layer 314', may serve as a hard mask during formation of diode 204 and may mitigate any overetching that may occur during formation of top conductor 208 (as described in the '936 Application, previously incorporated). For example, CNT seeding layer 314', barrier layer 316 and conductive layer 318 may be patterned and etched, and then serve as a mask during etching of diode 204. Etching of CNT seeding layer 314', conductive layer 318, barrier layer 316, silicide-forming metal layer 312, diode 204 (p+ polysilicon layer 306, intrinsic layer 304, n+ polysilicon layer 302) and barrier layer 308 creates a pillar structure 320. Dielectric material 322 is deposited on top of and around pillar structure 320 to isolate pillar structure 320 from other similar pillar structures of other memory cells (not shown) fabricated on a memory level that includes memory cell 200. A CMP or dielectric etchback step then is performed to planarize the dielectric material 322 and remove the dielectric material from the top of CNT seeding layer 314'.

Exemplary Fabrication Process for a Memory Cell

FIGS. 4A-D illustrate cross sectional views of a portion of a substrate 400 during fabrication of a first memory level in accordance with the present invention. As will be described below, the first memory level includes a plurality of memory cells that each include a reversible resistance-switching element formed by selectively fabricating CNT material above a substrate. Additional memory levels may be fabricated above the first memory level (as described previously with reference to FIGS. 2C-2D).

Figure 4A:
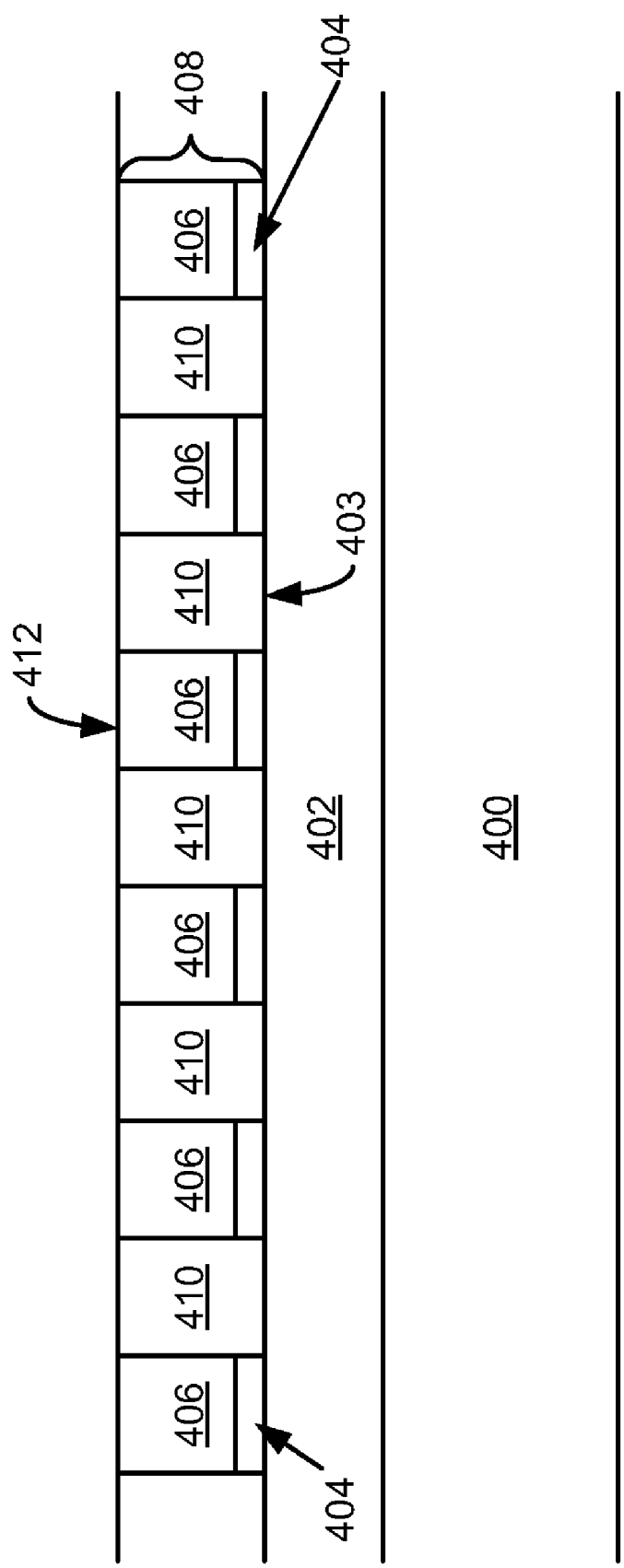
FIGS. 4A-D illustrate cross sectional views of a portion of a substrate during fabrication of a single memory level in accordance with this invention.

With reference to FIG. 4A, substrate 400 is shown as having already undergone several processing steps. Substrate 400 may be any suitable substrate such as a silicon, germanium, silicon-germanium, undoped, doped, bulk, silicon-on-insulator or other substrate with or without additional circuitry. For example, substrate 400 may include one or more n-well or p-well regions (not shown).

Isolation layer 402 is formed above substrate 400. In some embodiments, isolation layer 402 may be a layer of silicon dioxide, silicon nitride, silicon oxynitride or any other suitable insulating layer.

Following formation of isolation layer 402, an adhesion layer 404 is formed over isolation layer 402 (e.g., by physical vapor deposition or another method). For example, adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, the adhesion layer 404 may be optional.

After formation of adhesion layer 404, a conductive layer 406 is deposited over adhesion layer 404. Conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., CVD, physical vapor deposition ("PVD"), etc.). In at least one embodiment, conductive layer 406 may comprise about 200 to about 2500 angstroms of tungsten. Other conductive layer materials and/or thicknesses may be used.

Following formation of conductive layer 406, adhesion layer 404 and conductive layer 406 are patterned and etched. For example, adhesion layer 404 and conductive layer 406 may be patterned and etched using conventional lithography techniques, with a soft or hard mask, and wet or dry etch processing. In at least one embodiment, adhesion layer 404 and conductive layer 406 are patterned and etched to form substantially parallel, substantially co-planar conductors 408 (as shown in FIG. 4A). Exemplary widths for conductors 408 and/or spacings between conductors 408 range from about 200 to about 2500 angstroms, although other conductor widths and/or spacings may be used.

After conductors 408 have been formed, a dielectric layer 410 is formed over substrate 400 to fill the voids between conductors 408. For example, approximately 3000-7000 angstroms of silicon dioxide may be deposited on substrate 400 and planarized using chemical mechanical polishing or an etchback process to form a planar surface 412. Planar surface 412 includes exposed top surfaces of conductors 408 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, conductors 408 may be formed using a damascene process in which dielectric layer 410 is formed, patterned and etched to create openings or voids for conductors 408. The openings or voids then may be filled with adhesion layer 404 and conductive layer 406 (and/or a conductive seed, conductive fill and/or barrier layer if needed). Adhesion layer 404 and conductive layer 406 then may be planarized to form planar surface 412. In such an embodiment, adhesion layer 404 will line the bottom and sidewalls of each opening or void.

Figure 4B:
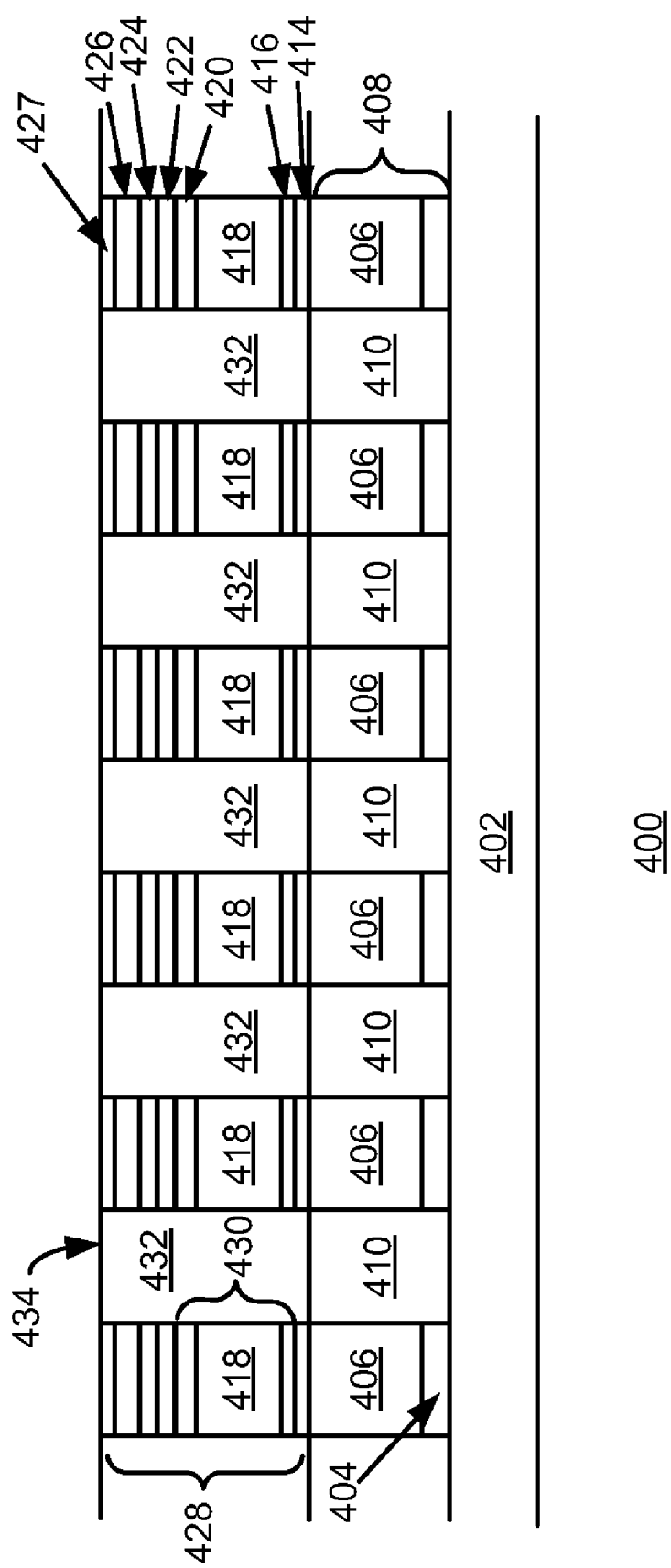
Figure 4C:
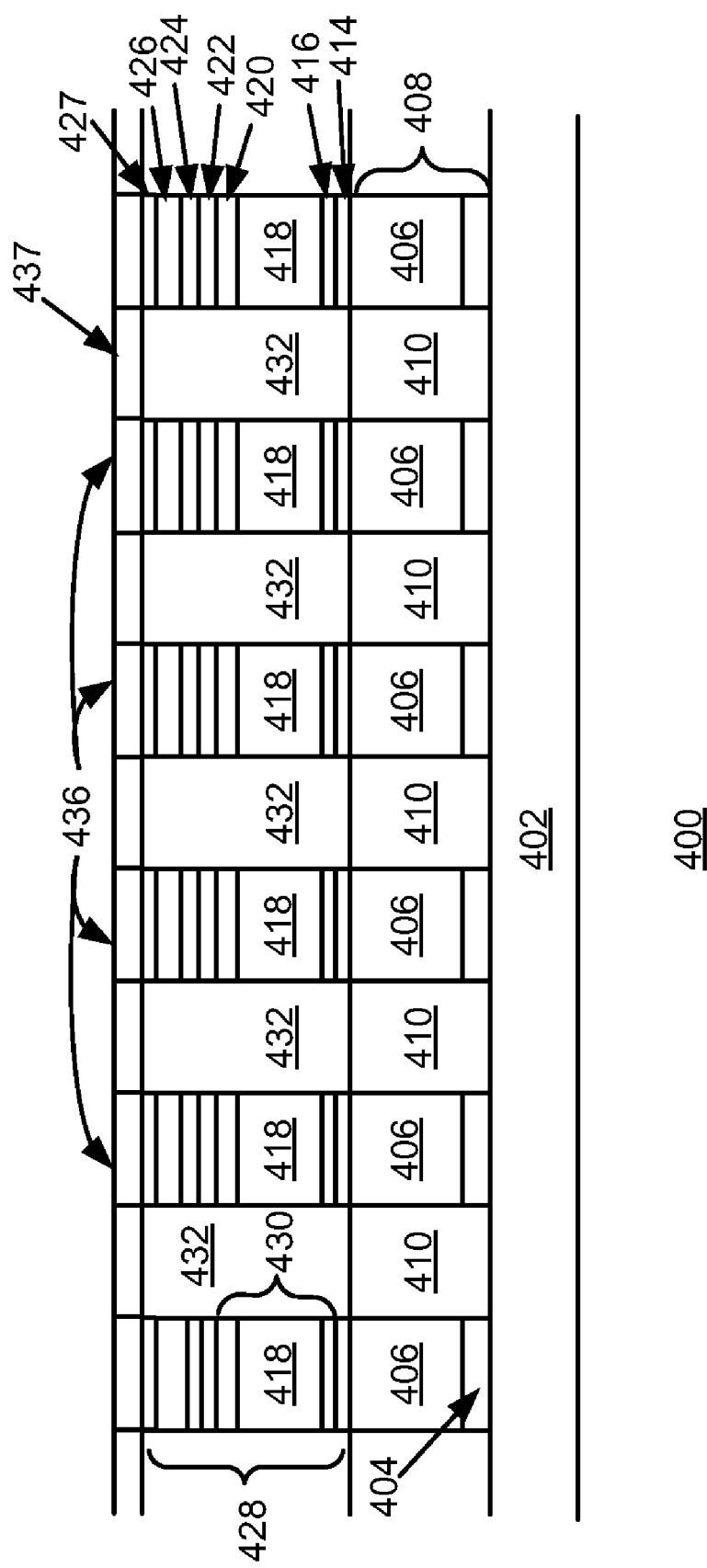

Following planarization, the diode structures of each memory cell are formed. With reference to FIG. 4B, a barrier layer 414 is formed over planarized top surface 412 of substrate 400. Barrier layer 414 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 414, deposition of the semiconductor material used to form the diode of each memory cell begins (e.g., diode 204 in FIGS. 2A-3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 414, a heavily doped n+ silicon layer 416 is deposited on barrier layer 414. In some embodiments, n+ silicon layer 416 is in an amorphous state as deposited. In other embodiments, n+ silicon layer 416 is in a polycrystalline state as deposited. CVD or another suitable process may be employed to deposit n+ silicon layer 416. In at least one embodiment, n+ silicon layer 416 may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 416 may be doped in situ, for example, by flowing a donor gas during deposition. Other doping methods may be used (e.g., implantation).

After deposition of n+ silicon layer 416, a lightly doped, intrinsic and/or unintentionally doped silicon layer 418 is formed over n+ silicon layer 416. In some embodiments, intrinsic silicon layer 418 is in an amorphous state as deposited. In other embodiments, intrinsic silicon layer 418 is in a polycrystalline state as deposited. CVD or another suitable deposition method may be employed to deposit intrinsic silicon layer 418. In at least one embodiment, intrinsic silicon layer 418 may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 416 prior to deposition of intrinsic silicon layer 418 to prevent and/or reduce dopant migration from n+ silicon layer 416 into intrinsic silicon layer 418 (as described in the '331 Application, previously incorporated).

Heavily doped, p-type silicon is either deposited and doped by ion implantation or is doped in situ during deposition to form a p+ silicon layer 420. For example, a blanket p+ implant may be employed to implant boron a predetermined depth within intrinsic silicon layer 418. Exemplary implantable molecular ions include $BF_2$, $BF_3$, B and the like. In some embodiments, an implant dose of about $1-5\times10^{15}$ ions/cm$^2$ may be employed. Other implant species and/or doses may be used. Further, in some embodiments, a diffusion process may be employed. In at least one embodiment, the resultant p+ silicon layer 420 has a thickness of about 100-700 angstroms, although other p+ silicon layer sizes may be used.

Following formation of p+ silicon layer 420, a silicide-forming metal layer 422 is deposited over p+ silicon layer 420. Exemplary silicide-forming metals include sputter or otherwise deposited titanium or cobalt. In some embodiments, silicide-forming metal layer 422 has a thickness of about 10 to about 200 angstroms, preferably about 20 to about 50 angstroms and more preferably about 20 angstroms. Other silicide-forming metal layer materials and/or thicknesses may be used.

A barrier layer 424 is deposited over silicide-forming metal layer 422. Barrier layer 424 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Following formation of barrier layer 424, a conductive layer 426 is formed over barrier layer 424. Conductive layer 426 may be about 50 to about 1000 angstroms, and preferably about 500 angstroms of conductive material such as tungsten or another suitable metal.

Following formation of conductive layer 426, a CNT seeding layer 427 is formed over conductive layer 426. In some embodiments, CNT seeding layer 427 may be about 1000 to about 5000 angstroms of titanium or tantalum nitride, although other thicknesses may be used.

In alternative embodiments, CNT seeding layer 427 may be about 1 to about 500 angstroms of Si/Ge, although other thicknesses may be used. The Si/Ge layer may be formed on conductive layer 426 by CVD, PECVD, or other similar processing techniques. Alternatively, a silicon seed layer may be formed over conductive layer 426, and germanium nano-islands may be selectively grown onto the silicon seed layer, such as by CVD. Selective germanium deposition may be performed using low pressure CVD techniques at approximately 500° C. and 100 mT with $GeH_4$. For either method, a carbon implant with dose of approximately $3\times10^{16}$ cm$^{-2}$ and energy of approximately 30 KeV may be used. Following implant, the surface may be treated with an approximately 30% $H_2O_2$ solution which results in a GeO or SiO growth of approximately 5 angstroms to approximately 19 angstroms.

Barrier layer 414, silicon regions 416, 418, and 420, silicide-forming metal layer 422, barrier layer 424, conductive layer 426 and CNT seeding layer 427 are then patterned and etched into pillars 428. For example, initially, CNT seeding layer 427, conductive layer 426 and barrier layer 424 are etched. The etch continues, etching silicide-forming metal layer 422, silicon regions 420, 418, and 416 and barrier layer 414. CNT seeding layer 427, conductive layer 426 and barrier layer 414 serve as a hard mask during the silicon etch. A hard mask is an etched layer which serves to pattern the etch of an underlying layer; if all of the photoresist present on CNT seeding layer 427 has been consumed, the hard mask can provide the pattern in its stead. In this manner, pillars 428 are formed in a single photolithographic step. Conventional lithography techniques, and wet or dry etch processing may be employed to form pillars 428. Each pillar 428 includes a p-i-n, downward-pointing diode 430. Upward-pointing p-i-n diodes may be similarly formed.

After pillars 428 have been formed, a dielectric layer 432 is deposited over pillars 428 to fill the voids between pillars 428. For example, approximately 200-7000 angstroms of silicon dioxide may be deposited and planarized using chemical mechanical polishing or an etchback process to form a planar surface 434. Planar surface 434 includes exposed top surfaces of pillars 428 separated by dielectric material 432 (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. CMP may be used to expose CNT seeding layer 427. If CNT seeding layer 427 is a Si/Ge seed layer, after the polish, the Si/Ge layer may be about 50 nm thick with an approximately 70% Si and approximately 30% Ge composition.

After formation of planar surface 434, CNT material 436 (FIG. 4C) is selectively formed on CNT seeding layer 427 of each pillar 428. If CNT seeding layer 427 is titanium nitride, tantalum nitride or a similar material, the surface of CNT seeding layer 427 may be roughened to allow CNTs to be formed directly on CNT seeding layer 427. See, e.g., the Smith Article and the Rao Article, referenced above. In one or more embodiments, CNT seeding layer 427 may be roughened to have an arithmetic average surface roughness Ra of at least about 850 to 4000 angstroms, and more preferably at least about 4000 angstroms. Other surface roughnesses may be employed.

In some embodiments, an additional metal catalyst/seeding layer (not shown) such as nickel, cobalt, iron, etc., may be selectively deposited over a surface-roughened CNT seeding layer 427 prior to formation of CNT material 436 to provide the benefits a metal catalyst during CNT formation (as described previously with reference to FIG. 3B). In other embodiments, a metal catalyst layer may be used without an underlying, surface roughened seeding layer (as described previously with reference to FIG. 3C).

In either case, a CNT fabrication process is performed to selectively grow and/or deposit CNT material 436 on each pillar 428. CNT material 436 serves as reversible resistance-switching element 202. Any suitable method may be used to form CNT material 436 on each pillar 428. For example, chemical vapor deposition (CVD), plasma-enhanced CVD, laser vaporization, electric arc discharge or the like may be employed.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

In still another embodiment, CNTs may be formed on a Si/Ge layer by CVD at a temperature of about 850° C. in methane diluted with $H_2$ gas for about 10 minutes.

As stated, CNT material 436 forms only over CNT seeding layer 427 of each pillar 428. In some embodiments, CNT material 436 may have a thickness of about 1 nanometers to about 1 micron (and even tens of microns), and more preferably about 10 to about 20 nanometers, although other CNT material thicknesses may be used. The density of individual tubes in CNT material 436 may be, for example, about $6.6\times10^3$ to about $1\times10^6$ CNTs/micron$^2$, and more preferably at least about $6.6\times10^4$ CNTs/micron$^2$, although other densities may be used. For example, assuming that pillars 428 have a width of about 45 nanometers, in some embodiments, it is preferred to have at least about 10 CNTs, and more preferably at least about 100 CNTs, in CNT material 436 formed on each pillar 428 (although fewer CNTs, such as 1, 2, 3, 4, 5, etc., or more CNTs, such as more than 100, may be employed).

Following formation of CNT material/reversible resistance-switching element 436 on each pillar 428, dielectric material 437 is deposited on top of and around the regions of CNT material 436 to isolate adjacent CNT material regions from one another. A CMP or dielectric etchback step then is performed to planarize dielectric material 437 and remove the dielectric material from the top of the regions of CNT material 436. For example, approximately 200-7000 angstroms, and in some embodiments a micron or more, of silicon dioxide may be deposited and planarized using chemical mechanical polishing or an etchback process. If the CNTs have been exposed to air for significant amounts of time, a dehydration anneal prior to the dielectric deposition might improve adhesion between the dielectric and the CNT. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4D:
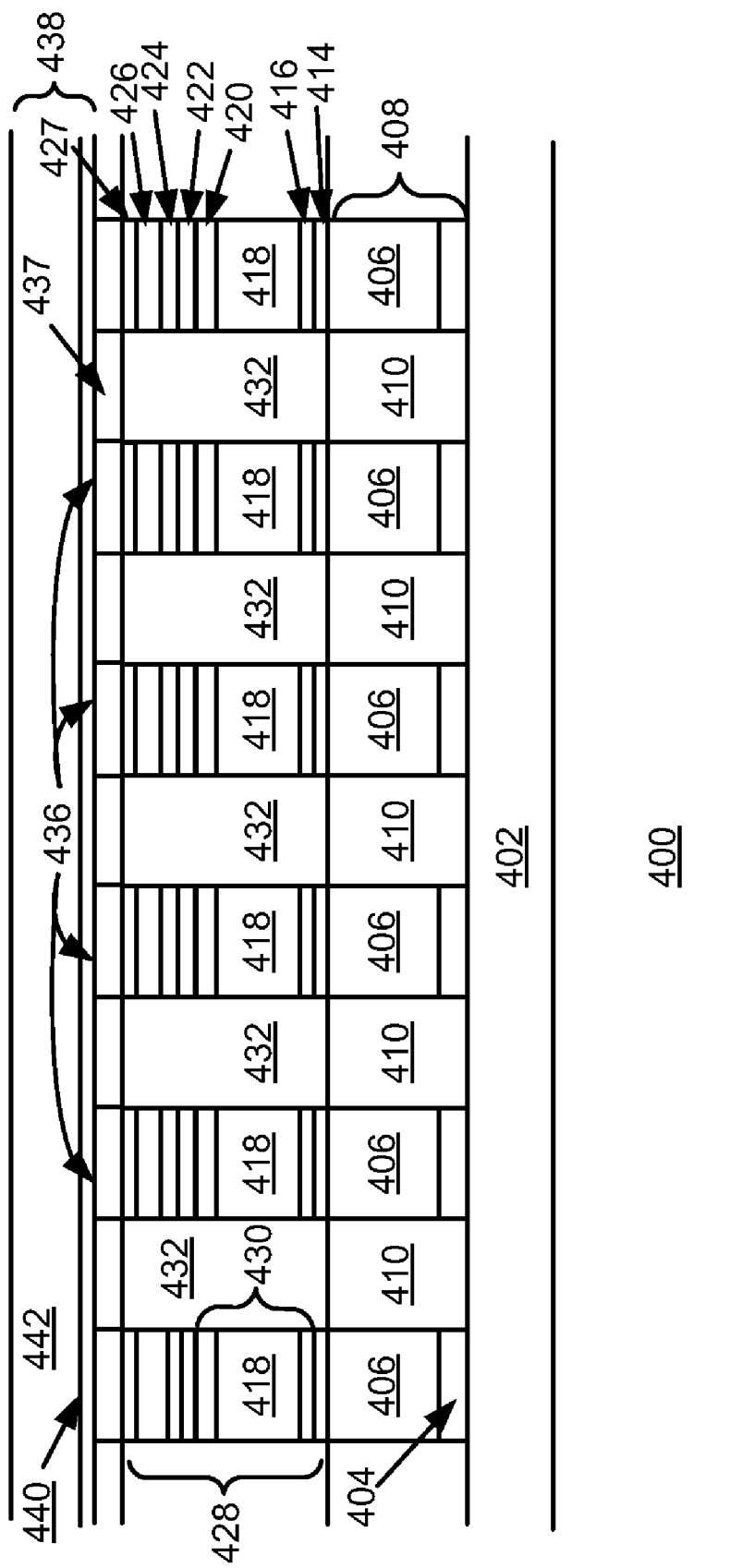

With reference to FIG. 4D, following planarization of dielectric material 437, a second set of conductors 438 may be formed above pillars 428 in a manner similar to the formation of the bottom set of conductors 408. For example, as shown in FIG. 4D, in some embodiments, one or more barrier layers and/or adhesion layers 440 may be deposited over reversible resistance-switching elements 436 prior to deposition of a conductive layer 442 used to form the upper, second set of conductors 438.

Conductive layer 442 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 440 may include titanium nitride or another suitable layer such as tantalum nitride, tungsten nitride, combinations of one or more layers, or any other suitable material(s). The deposited conductive layer 442 and barrier and/or adhesion layer 440, may be patterned and etched to form second set of conductors 438. In at least one embodiment, upper conductors 438 are substantially parallel, substantially coplanar conductors that extend in a different direction than lower conductors 408.

In other embodiments of the invention, upper conductors 438 may be formed using a damascene process in which a dielectric layer is formed, patterned and etched to create openings or voids for conductors 438. As described in the '936 Application, conductive layer 426 and barrier 424 may mitigate the effects of overetching of such a dielectric layer during formation of the openings or voids for upper conductors 438, preventing accidental shorting of diodes 430.

The openings or voids may be filled with adhesion layer 440 and conductive layer 442 (and/or a conductive seed, conductive fill and/or barrier layer if needed). Adhesion layer 440 and conductive layer 442 then may be planarized to form a planar surface.

Following formation of upper conductors 438, the resultant structure may be annealed to crystallize the deposited semiconductor material of diodes 430 (and/or to form silicide regions by reaction of silicide-forming metal layer 422 with p+ region 420). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 422 and p+ region 420 react may serve as "crystallization templates" or "seeds" during annealing for underlying deposited semiconductor material that forms diodes 430 (e.g., changing any amorphous semiconductor material to polycrystalline semiconductor material and/or improving overall crystalline properties of diodes 430). Lower resistivity diode material thereby is provided.

Alternative Exemplary Memory Cell

Figure 5:
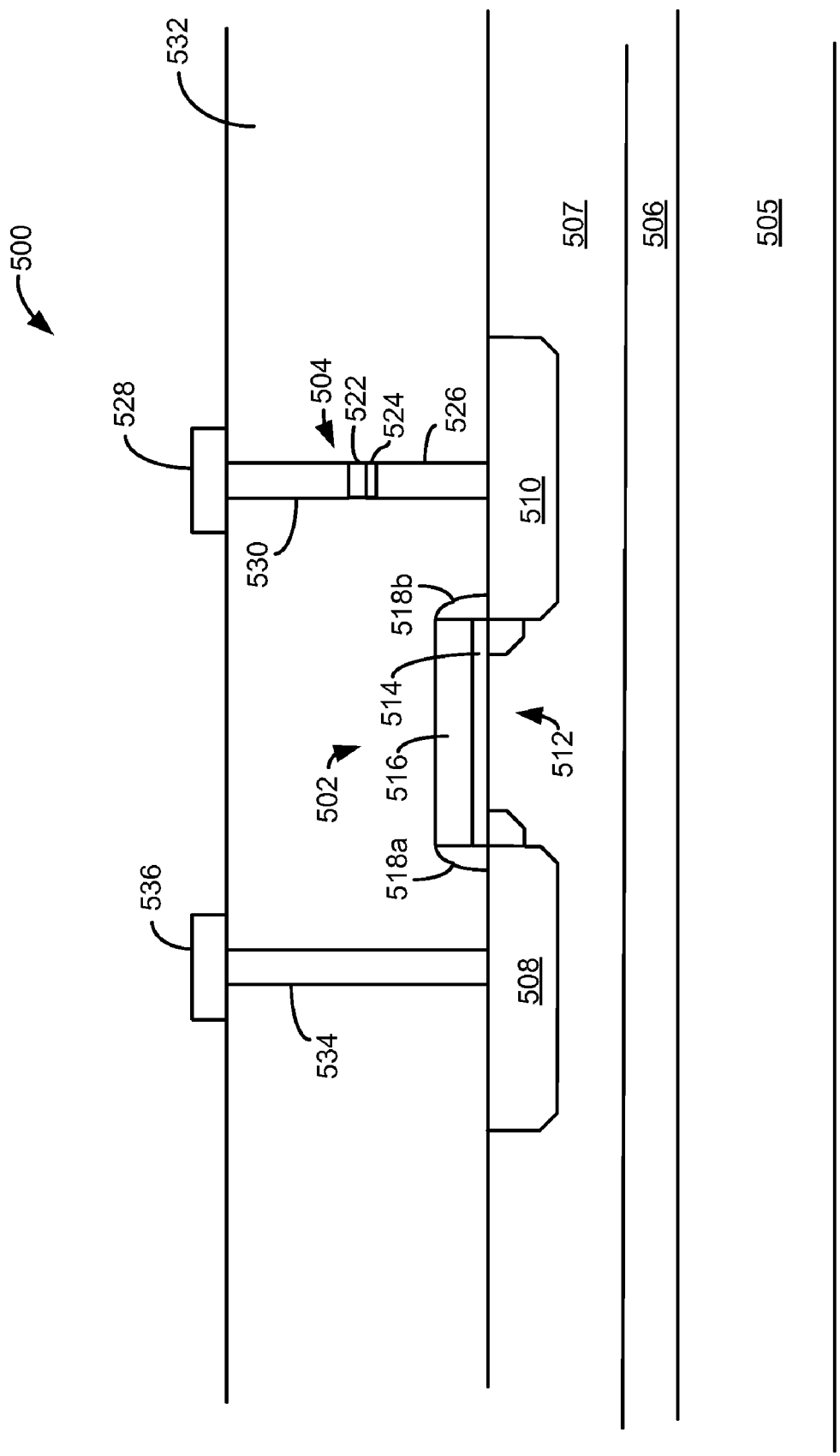
FIG. 5 is a cross sectional view of a first alternative memory cell provided in accordance with this invention.

FIG. 5 is a cross sectional view of an exemplary memory cell 500 provided in accordance with the present invention. Memory cell 500 includes a thin film transistor ("TFT"), such as a thin film, metal oxide semiconductor field effect transistor ("MOSFET") 502 coupled to a reversible resistance-switching element 504 formed above a substrate 505. For example, MOSFET 502 may be an n-channel or a p-channel thin film MOSFET formed on any suitable substrate. In the embodiment shown, an insulating region 506 such as silicon dioxide, silicon nitride, oxynitride, etc., is formed above substrate 505 and a deposited semiconductor region 507 such as deposited silicon, germanium, silicon-germanium, etc., is formed above insulating region 506. Thin film MOSFET 502 is formed within deposited semiconductor region 507 and is insulated from substrate 505 by the insulating region 506.

MOSFET 502 includes source/drain regions 508, 510 and channel region 512, as well as gate dielectric layer 514, gate electrode 516 and spacers 518a-b. In at least one embodiment, source/drain regions 508, 510 may be doped p-type and channel region 512 may be doped n-type, wheras in other embodiments source/drain regions 508, 510 may be doped n-type and channel region 512 may be doped p-type. Any other MOSFET configuration or any suitable fabrication techniques may be employed for thin film MOSFET 502. In some embodiments, MOSFET 502 may be electrically isolated by isolation regions (not shown) formed using an STI, LOCOS or other similar process. Alternatively, gate, source and/or drain regions of MOSFET 502 may be shared with other transistors (not shown) formed on the substrate 505.

Reversible resistance-switching element 504 includes a reversible resistivity-switching CNT material 522 formed over a conductive plug 526. In at least one embodiment, reversible resistivity-switching CNT material 522 is formed using a selective formation process as previously described with reference to the embodiments of FIGS. 1-4D. For example, a CNT seeding layer 524 such as titanium or tantalum nitride and/or a metal catalyst such as nickel, cobalt, iron, etc., or a Si/Ge layer may be formed over conductive plug 526. CNT material 522 then may be selectively formed over CNT seeding layer 524 as previously described.

As shown in FIG. 5, reversible resistance-switching element 504 is coupled to source/drain region 510 of MOSFET 502 by a first conductive plug 526 and to a first metal level ("M1") line 528 by a second conductive plug 530 (which extend through a dielectric layer 532). Likewise, a third conductive plug 534 couples source/drain region 508 of MOSFET 502 to an M1 line 536. The conductive plugs and/or lines may be formed from any suitable materials (without or without barriers layers) such as tungsten, another metal, heavily doped semiconductor material, a conductive silicide, a conductive silicide-germanide, a conductive germanide, or the like. Note that when MOSFET 502 is an n-channel device, region 508 serves as the drain and region 510 serves as the source for MOSFET 502; and when MOSFET 502 is an p-channel device, region 508 serves as the source and region 510 serves as the drain for MOSFET 502. Dielectric layer 532 may include any suitable dielectric such as silicon dioxide, silicon nitride, silicon oxynitride, low K dielectrics, etc.

In memory cell 500, thin film MOSFET 502 operates as a steering element in a manner similar to that of the diodes employed in the memory cells of FIGS. 2A-4D, selectively limiting the voltage applied across and/or the current flow through reversible resistance-switching element 504.

This integration scheme can be extended to selectively grow vertically oriented CNT films in series with a TFT as the steering element instead of the vertical pillar diode. The TFT steering element may be either planar or vertical.

The foregoing description discloses only exemplary embodiments of the invention. Modifications of the above disclosed apparatus and methods which fall within the scope of the invention will be readily apparent to those of ordinary skill in the art.

Accordingly, although the present invention has been disclosed in connection with exemplary embodiments thereof, it should be understood that other embodiments may fall within the spirit and scope of the invention, as defined by the following claims.

The invention claimed is:

1. A method of fabricating a memory cell, the method comprising:
    fabricating a steering element above a substrate; and
    fabricating a reversible-resistance switching element coupled to the steering element by:
        fabricating a carbon nano-tube ("CNT") seeding layer by depositing a silicon-germanium layer above the substrate;
        patterning and etching the CNT seeding layer; and
        selectively fabricating CNT material on the CNT seeding layer.

2. The method of claim 1, wherein patterning and etching the CNT seeding layer includes patterning and etching the steering element.

3. The method of claim 1, wherein selectively fabricating CNT material on the CNT seeding layer includes depositing CNT material on the CNT seeding layer using chemical vapor deposition.

4. The method of claim 1, further comprising creating defects in the CNT material to tune switching characteristics of the CNT material.

5. The method of claim 1, wherein the reversible-resistance switching element is fabricated above the steering element.

6. The method of claim 1, wherein fabricating the steering element comprises fabricating a p-n or p-i-n diode.

7. The method of claim 1, wherein fabricating the steering element comprises fabricating a polycrystalline diode.

8. The method of claim 1, wherein fabricating the steering element comprises fabricating a vertical polycrystalline diode.

9. The method of claim 1, wherein fabricating the steering element comprises fabricating a vertical polycrystalline diode having polycrystalline material that is in a low-resistivity state.

10. The method of claim 1, wherein fabricating the steering element comprises fabricating a thin film transistor.

11. The method of claim 1, wherein fabricating the steering element comprises fabricating a thin film, metal oxide semiconductor field effect transistor.

12. The method of claim 1, wherein selectively fabricating the CNT material includes fabricating CNT material having CNTs that are substantially vertically aligned to reduce lateral conduction in the CNT material.

13. A method of fabricating a memory cell, the method comprising:
    fabricating a first conductor above a substrate;
    fabricating a reversible-resistance switching element above the first conductor by:
        fabricating a carbon nano-tube ("CNT") seeding layer by depositing a silicon-germanium layer above the first conductor;
        patterning and etching the CNT seeding layer; and
        selectively fabricating CNT material on the CNT seeding layer;
    fabricating a diode above the first conductor; and
    fabricating a second conductor above the diode and the reversible resistance-switching element.

14. The method of claim 13, wherein patterning and etching the CNT seeding layer includes patterning and etching the diode.

15. The method of claim 13, wherein the reversible-resistance switching element is fabricated above the diode.

16. The method of claim 13, wherein fabricating the diode comprises fabricating a vertical polycrystalline diode.

17. The method of claim 13, further comprising fabricating a silicide, silicide-germanide or germanide region in contact with polycrystalline material of the vertical polycrystalline diode so that the polycrystalline material is in a low-resistivity state.

18. The method of claim 13, wherein selectively fabricating the CNT material includes fabricating CNT material having CNTs that are substantially vertically aligned so as to reduce lateral conduction in the CNT material.

19. A method of fabricating a memory cell, the method comprising:
    fabricating a thin film transistor having a source region and a drain region;
    fabricating a first conductor coupled to the source region or the drain region of the transistor;
    fabricating a reversible-resistance switching element coupled to the first conductor by:
        fabricating a carbon nano-tube ("CNT") seeding layer by depositing a silicon-germanium layer above the first conductor;
        patterning and etching the CNT seeding layer; and
        selectively fabricating CNT material on the CNT seeding layer;
    fabricating a diode above the first conductor; and
    fabricating a second conductor above the reversible resistance-switching element.

20. The method of claim 19, wherein selectively fabricating the CNT material includes fabricating CNT material having CNTs that are substantially vertically aligned so as to reduce lateral conduction in the CNT material.

* * * * *